(12) United States Patent
Chen

(10) Patent No.: US 8,810,288 B2
(45) Date of Patent: Aug. 19, 2014

(54) OUTPUT BUFFER

(71) Applicant: Novatek Microelectronics Corp., Hsinchu (TW)

(72) Inventor: Chun-Hung Chen, Yunlin County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 13/786,481

(22) Filed: Mar. 6, 2013

(65) Prior Publication Data

US 2014/0009191 A1   Jan. 9, 2014

(30) Foreign Application Priority Data

Jul. 5, 2012 (TW) .............................. 101124261 A

(51) Int. Cl.
*H03B 1/00* (2006.01)
(52) U.S. Cl.
USPC ............................ 327/112; 327/108; 327/391
(58) Field of Classification Search
USPC ................. 327/108–112, 170, 382, 389, 391; 326/26, 27, 82, 83
See application file for complete search history.

(56) References Cited

U.S. PATENT DOCUMENTS

| 7,482,845 | B2 * | 1/2009 | Lee et al. ....................... 327/112 |
| 2009/0212862 | A1 * | 8/2009 | Kuroki ......................... 330/253 |

* cited by examiner

*Primary Examiner* — Long Nguyen
(74) *Attorney, Agent, or Firm* — Jianq Chyun IP Office

(57) ABSTRACT

An output buffer is disclosed. The output buffer includes an input-stage circuit, an output-stage circuit and a compensation circuit. The compensation circuit includes a capacitor, a first switch, a second switch, a third switch, and a fourth switch. The input-stage circuit receives a differential input signal and outputting a response signal. The output-stage circuit receives the response signal and outputting an output signal. The first switch controls a connection between the input-stage circuit and a first terminal of the capacitor. The second switch controls the connection between an output terminal of the compensation circuit and a second terminal of the capacitor. The third switch controls the connection between the input-stage circuit and the second-terminal of the capacitor. The forth switch controls the connection between the output terminal of the compensation circuit and the first terminal of the capacitor.

20 Claims, 5 Drawing Sheets

OUTPUT BUFFER

CROSS-REFERENCE TO RELATED APPLICATION

This application claims the priority benefit of Taiwan application serial no. 101124261, filed on Jul. 5, 2012. The entirety of the above-mentioned patent application is hereby incorporated by reference herein and made a part of this specification.

BACKGROUND

1. Field of the Invention

The present invention is directed to an output buffer having a compensation capacitor and more particularly, to an output buffer having switches for switching two terminals of a compensation capacitor.

2. Description of Related Art

An output buffer mainly functions as providing a buffering mechanism for impedance matching to a signal terminal and a load terminal. As for the signal terminal, an input terminal of the output buffer provides an input of a quite high input impedance to completely receive a signal outputted from the signal terminal so as to avoid an actuation of the signal inputted from the output buffer. In addition, an output terminal of the output buffer provides an output with low output impedance connected to a load so as to avoid reducing a maximum power that can be outputted by the output buffer due to additional loading effect.

Referring to FIG. 1, FIG. 1 is a structural schematic diagram illustrating an output buffer 100 in the related art. The output buffer 100 includes an input-stage unit 110, an intermediate-stage unit 120, an output-stage unit 130 and a compensation capacitor Cc. The input-stage unit 110 converts a doubled-ended differential input signal Vid to a single-ended differential output signal SS and provides a part of gain. The intermediate-stage unit 120 is used as a buffer and mainly used to compensate a frequency response of a signal to enhance bandwidth of a circuit. Lastly, the compensated signal is transmitted to the output-stage unit 130. The output-stage unit 130 is mainly used to enhance driving ability of the circuit and adequately provide a part of gain.

How the output buffer 100 is operated is described hereinafter. When a status of an input voltage of the input-stage unit 110 is changed, a voltage of an output terminal of the input-stage unit 110 is also changed. When a positive input voltage V1 of the input-stage unit 110 is greater than a negative input voltage V2, an output of a high-state voltage potential is generated in the output terminal of the input-stage unit 110. Otherwise, when the positive input voltage V1 of the input-stage unit 110 is smaller than the negative input voltage V2, an output of a low-state voltage potential is generated in the output terminal of the input-stage unit 110. In addition, an output signal SS of the input-stage unit 110 is transmitted to an input terminal of the intermediate-stage unit 120. The intermediate-stage unit 120 is typically composed of a common-gate (CG) amplifier and mainly configured to provide a low-impedance node to the input-stage unit 110. Thus, a pole generated by the output terminal of the input-stage unit 110 is away from a dominant pole so that the output buffer 100 may ignore influence brought by the node on the entire bandwidth.

Moreover, the compensation capacitor Cc is across-connected with the input terminal of the intermediate-stage unit 120 and an output terminal of the output-stage unit 130. The compensation capacitor Cc is mainly configured for compensation of pole-splitting so that positions of two adjacent poles are split as a low-frequency dominant pole and a position of high frequency capable of ignoring a secondary pole.

Since the output buffer 100 needs the compensation capacitor Cc for the pole-splitting, the compensation capacitor Cc has to be charged or discharged every time when a state of the output terminal of the input-stage unit 110 is changed. Thus, a large signal response speed of the output buffer 100 is determined based on a speed of which the compensation capacitor Cc is charged of discharged by a bias current of the input-stage unit 110. If the compensation capacitor Cc is larger and the bias current of the input-stage unit 110 is smaller, the large signal response speed of the output buffer 100 is the slower. Otherwise, if the compensation capacitor Cc is smaller and the bias current of the input-stage unit 110 is larger, the large signal response speed of the output buffer 100 is faster.

Typically, for maintaining the feature of a normal frequency response, the size of compensation capacitor Cc is fixed once selected. As a result, only the bias current of the input-stage unit 110 is adjustable. In order to increase the large signal response speed of the output buffer 100, the bias current of the input-stage unit 110 has to be designed as larger, which results in increment of entire power consumption of the output buffer 100 and becomes a major issue in this field.

SUMMARY

The present invention is directed to an output buffer capable of charging a compensation capacitor slowly without using a bias current of an input-stage circuit, so that a response speed of the internal of the output buffer is improved. And, without re-charging/re-discharging the compensation capacitor, additional dynamical power consumption can be reduced.

The present invention is directed to an output buffer including an input-stage circuit, an output-stage circuit and a compensation circuit. The compensation circuit includes a first compensation capacitor, a first switch, a second switch, a third switch and a fourth switch. The input-stage circuit is configured to receive a differential input signal to output a response signal. The output-stage circuit is coupled to the input-stage circuit and configured to receive the response signal to output an output signal. The compensation circuit is coupled between the input-stage circuit and an output terminal of the output-stage circuit. The first compensation capacitor has a first terminal and a second terminal. The first switch is configured to control an electrical connection between the input-stage circuit and the first terminal of the first compensation capacitor. The second switch is configured to control an electrical connection between an output terminal of the compensation circuit and the second terminal of first compensation capacitor. The third switch is configured to control an electrical connection between the input-stage circuit and the second terminal of the first compensation capacitor. The fourth switch is configured to control an electrical connection between the output terminal of the compensation circuit and the first terminal of the first compensation capacitor. Turn-on/turn-off time of the first switch is consistent with that of the second switch, and turn-on/turn-off time of the third switch is consistent with that of the fourth switch. When the first switch and the second switch are turned on, the third switch and the fourth switch are turned off. When the third switch and the fourth switch are turned on, the first switch and the second switch are turned off.

In an embodiment of the present invention, the differential input signal includes a positive input signal and a negative input signal. The input-stage circuit includes a differential pair unit and a current mirror unit. The differential pair unit outputs the response signal according to the positive input signal and the negative input signal that are received. The current mirror unit is coupled to the differential pair unit and configured to provide a bias current and a mirrored current, wherein the current mirror unit maps the bias current to generate the mirrored current.

In an embodiment of the present invention, the output buffer further comprises a detection circuit configured to control the first switch, the second switch, the third switch and the fourth switch according to the positive input signal and the negative input signal.

In an embodiment of the present invention, the current mirror unit is a current mirror circuit. The current mirror circuit includes a first transistor and a second transistor. A first source/drain terminal of the first transistor is coupled to a first voltage. A second source/drain terminal and a gate terminal of the first transistor are coupled to a first node of the current mirror circuit. A gate terminal of the second transistor is coupled to the gate terminal of the first transistor. A first source/drain terminal of the second transistor is coupled to the first voltage, and a second source/drain terminal of the second transistor is coupled to a second node of the current mirror circuit. The first node is coupled to the differential pair unit. The second node is coupled to the differential pair unit and an input terminal of the compensation circuit. The bias current flows to the differential pair unit through the first node, and the mirrored current is outputted from the second node.

In an embodiment of the present invention, the first voltage is a power voltage.

In an embodiment of the present invention, the first voltage is a ground voltage.

In an embodiment of the present invention, the differential pair unit is a differential amplifier. The differential amplifier includes a third transistor, a fourth transistor and a fifth transistor. A gate terminal of the third transistor receives the negative input signal, and a first source/drain terminal of the third transistor is coupled to the first node of the current mirror circuit of the current mirror circuit. A gate terminal of the fourth transistor receives the positive input signal, and a first source/drain terminal of the fourth transistor is coupled to the second node of the current mirror circuit, wherein the response signal is outputted from the second node. A gate terminal of the fifth transistor receives a first bias voltage, and a first source/drain terminal of the fifth transistor is coupled to the second source/drain terminal of the third transistor and the second source/drain terminal of the fourth transistor. The second source/drain terminal of the fifth transistor is coupled to a second voltage.

In an embodiment of the present invention, the second voltage is a power voltage.

In an embodiment of the present invention, the second voltage is a ground voltage.

In an embodiment of the present invention, the output-stage circuit includes a sixth transistor and a seventh transistor. A gate terminal of the sixth transistor is coupled to the first node, a first source/drain terminal of the sixth transistor is coupled to the first voltage, and a second source/drain terminal of the sixth transistor is coupled to a third node. A gate terminal of the seventh transistor is coupled to the second node and configured to receive the response signal, a first source/drain terminal of the seventh transistor is couple to the third node and configured to output the output signal, and a second source/drain terminal of the seventh transistor is coupled to the second voltage.

In an embodiment of the present invention, the current mirror unit is a rail-to-rail current mirror circuit, and the differential pair unit is a rail-to-rail differential amplifier.

In an embodiment of the present invention, the rail-to-rail current mirror circuit includes an eighth transistor, a ninth transistor, a tenth transistor and an eleventh transistor. A source terminal of the eighth transistor is coupled to the first voltage, a gate terminal of the eighth transistor is coupled to a fourth node and a drain terminal of the eighth transistor is coupled to a fifth node. A source terminal of the ninth transistor is coupled to the first voltage, a gate terminal of the ninth transistor is coupled to the fourth node and a drain terminal of the ninth transistor is coupled to a sixth node, wherein the first switch is coupled to the sixth node. A source terminal of the tenth transistor is coupled to the fifth node, a drain terminal of the tenth transistor is coupled to the fourth node, and a gate terminal of the tenth transistor receives a second bias voltage. A source terminal of the eleventh transistor is coupled to the sixth node, a gate terminal of the eleventh transistor is coupled to the gate terminal of the tenth transistor and a drain terminal of the eleventh transistor is coupled to a seventh node.

In an embodiment of the present invention, the rail-to-rail current mirror circuit further includes a first impedance-providing device and a second impedance-providing device. A terminal of the first impedance-providing device is coupled to the fourth node, and the other terminal thereof is coupled to an eighth node. A terminal of the second impedance-providing device is coupled to the seventh node and the other terminal thereof is coupled to a ninth node, wherein the response signal is outputted from the seventh node and the ninth node.

In an embodiment of the present invention, the rail-to-rail current mirror circuit further includes a twelfth transistor, a thirteenth transistor, a fourteenth transistor and a fifteenth transistor. A drain terminal of the twelfth transistor is coupled to the eighth node, a source terminal of the twelfth transistor is coupled to a tenth node, and a gate terminal of the twelfth transistor is coupled to a third bias voltage. A drain terminal of the thirteenth transistor is coupled to the ninth node, a gate terminal of the thirteenth transistor is coupled to the gate terminal of the twelfth transistor, and a source terminal of the thirteenth transistor is coupled to an eleventh node, wherein the third switch coupled to the eleventh node. A drain terminal of the fourteenth transistor is coupled to the tenth node, a gate terminal of the fourteenth transistor is coupled to the eighth node, and a source terminal of the fourteenth transistor is coupled to the second voltage. A drain terminal of the fifteenth transistor is coupled to the eleventh node, a gate terminal of the fifteenth transistor is coupled to the eighth node and a source terminal of the fifteenth transistor is coupled to the second voltage. The fifth node and the tenth node are coupled to the rail-to-rail differential amplifier, and the sixth node and the eleventh node are coupled to the rail-to-rail differential amplifier and the input terminal of the compensation circuit.

In an embodiment of the present invention, the rail-to-rail differential amplifier includes a P-type differential amplifier and an N-type differential amplifier.

In an embodiment of the present invention, the P-type differential amplifier includes a sixteenth transistor, a seventeenth transistor and an eighteenth transistor. A gate terminal of the sixteenth transistor receives the negative input signal, and a drain terminal of the sixteenth transistor is coupled to the tenth node of the rail-to-rail current mirror circuit. A gate terminal of the seventeenth transistor receives the positive input signal, and a drain terminal of the seventeenth transistor is coupled to the eleventh node of the rail-to-rail current mirror circuit. A gate terminal of the eighteenth transistor receives a fourth bias voltage, a drain terminal of the eighteenth transistor is coupled to the source terminal of the sixteenth transistor and the source terminal of the seventeenth transistor, and a source terminal of the eighteenth transistor is coupled to the first voltage.

In an embodiment of the present invention, the N-type differential amplifier includes a nineteenth transistor, a twentieth transistor and a twenty-first transistor. A gate terminal of the nineteenth transistor receives the negative input signal, and a drain terminal of the nineteenth transistor is coupled to the fifth node of the rail-to-rail current mirror circuit. A gate terminal of the twentieth transistor receives the positive input signal, and a drain terminal of the twentieth transistor is coupled to the sixth node of the rail-to-rail current mirror circuit. A gate terminal of the twenty-first transistor receives a fifth bias voltage, a drain terminal of the twenty-first transistor is coupled to the source terminal of the nineteenth transistor and the source terminal of the twentieth transistor, and a source terminal of the twenty-first transistor is coupled to the second voltage.

In an embodiment of the present invention, the compensation circuit further includes a second compensation capacitor, a fifth switch, a sixth switch, a seventh switch and an eighth switch. The second compensation capacitor has a first terminal and a second terminal. The fifth switch is configured to control an electrical connection between the input-stage circuit and the second terminal of the second compensation capacitor. The sixth switch is configured to control an electrical connection between the output terminal of the compensation circuit and the first terminal of the second compensation capacitor. The seventh switch is configured to control an electrical connection between the input-stage circuit and the first terminal of the second compensation capacitor. The eighth switch is configured to control an electrical connection between the output terminal of the compensation circuit and the second terminal of the second compensation capacitor. Therein, turn-on/turn-off time of the fifth switch is consistent with that of the sixth switch, and turn-on/turn-off time of the seventh switch is consistent with that of the eighth switch. When the fifth switch and the sixth switch are turned on, the seventh switch and the eighth switch are turned off When the seventh switch and the eighth switch are turned on, the fifth switch and the sixth switch are turned off.

In an embodiment of the present invention, the turn-on/turn-off time of the fifth switch and the sixth switch is consistent with that of the first switch and the second switch, and the turn-on/turn-off time of the seventh switch and the eighth switch is consistent with that of the third switch and the fourth switch. When the first switch, the second switch, the fifth switch and the sixth switch are turned on, the third switch, the fourth switch, the seventh switch and the eighth switch are turned off When the third switch, fourth switch, seventh switch and the eighth switch are turned on, the first switch, the second switch, the fifth switch and the sixth switch are turned off.

In an embodiment of the present invention, the output-stage circuit includes a twenty-second transistor and a twenty-third transistor. A gate terminal of the twenty-second transistor is coupled to the seventh node, a source terminal of the twenty-second transistor is coupled to the first voltage, and a drain terminal of the twenty-second transistor is coupled to a twelfth node. A gate terminal of the twenty-third transistor is coupled to the ninth node and configured to receive the response signal, a drain terminal of the twenty-third transistor is coupled to the twelfth node and configured to output the output signal, and a source terminal of the twenty-third transistor is coupled to the second voltage.

To sum up, the first switch, the second switch, the third switch and the fourth switch of the present invention are utilized to control the electrical connection between the first terminal and the second terminal of the first compensation capacitor and the input terminal and the output terminal of the compensation circuit. Thus, the compensation capacitor is charged slowly without using the bias current of the input-stage circuit is not needed, so that the response speed of the internal of the output buffer is improved, and without re-charging/re-discharging the compensation capacitor, additional dynamic power consumption can be reduced.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

An output buffer according to embodiments of the present invention will be described hereinafter, which utilizes a technique alternatively switching a plurality of switches to change positions of two terminals coupled to a compensation capacitor, such that electrical charges on the compensation capacitor can be maintained to improve a response speed of the internal of the output buffer. Besides, without re-charging or re-discharging the compensation capacitor, additional dynamic power consumption can be reduced. In order to make the aforementioned and other objectives, features, and advantages of the present invention more comprehensible, embodiments accompanied with figures are described in detail below.

Figure 1:
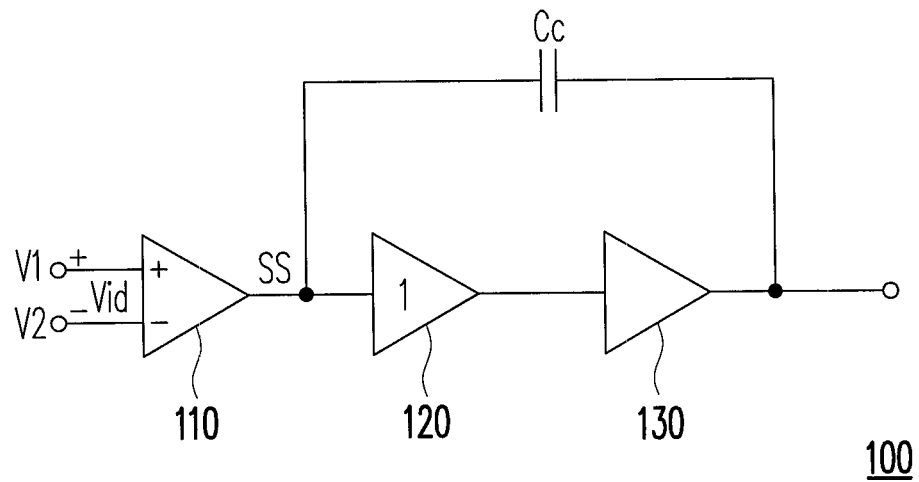
FIG. 1 is a structural schematic diagram illustrating an output buffer in the related art.
Figure 2:
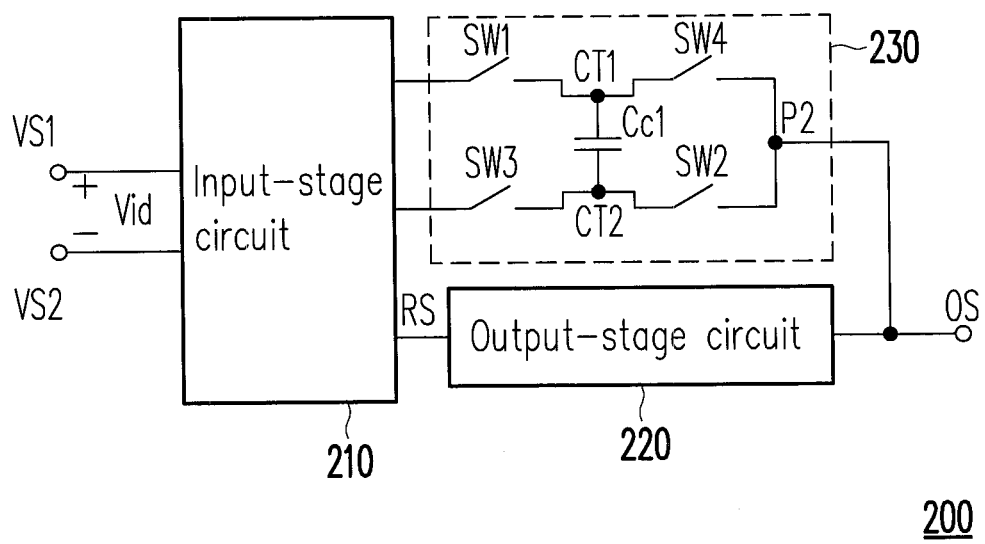
FIG. 2 is a structural schematic diagram illustrating an output buffer according to an embodiment of the present invention.

FIG. 2 is a structural schematic diagram illustrating an output buffer according to an embodiment of the present invention. Referring to FIG. 2, an output buffer 200 includes an input-stage circuit 210, an output-stage circuit 220 and a compensation circuit 230. The input-stage circuit 210 is configured to receive a differential input signal Vid and output a response signal RS. The output-stage circuit 220 is coupled to the input-stage circuit 210 and configured to receive the response signal RS to output an output signal OS. The compensation circuit 230 is coupled between the input-stage circuit 210 and an output terminal of the output-stage circuit 220. Besides, the compensation circuit 230 includes a compensation capacitor Cc1 and switches SW1~SW4. The compensation capacitor Cc1 has a first terminal CT1 and a second terminal CT2. The switch SW1 is configured to control an electrical connection between the input-stage circuit 210 and the first terminal CT1 of the compensation capacitor Cc1. The switch SW2 is configured to control an electrical connection between an output terminal P2 of the compensation circuit 230 and the second terminal CT2 of the compensation capacitor Cc1. The switch SW3 is configured to control an electrical connection between the input-stage circuit 210 and the second terminal CT2 of the compensation capacitor Cc1. The SW4 is configured to control an electrical connection between the output terminal P2 of the compensation circuit 230 and the first terminal CT1 of the compensation capacitor Cc1.

The input-stage circuit 210 may include one or more output terminals. In an embodiment of the present invention, the input-stage circuit 210 includes a single output terminal. The switch SW1, the switch SW3 and an output-stage circuit 22 are coupled to the same output terminal of the input-stage circuit 210 for receiving the response signal RS. Moreover, in another embodiment of the present invention, the input-stage circuit 210 may include a plurality of output terminals. The switch SW1, the switch SW3 and the output-stage circuit 22 are coupled to different output terminals of the input-stage circuit 210. Additionally, in an embodiment of the present invention, the input-stage circuit 210 includes two output terminals. Both of the switch SW1 and the switch SW3 are coupled to one output terminal of the input-stage circuit 210, while the output-stage circuit 22 is coupled to the other output terminal of the input-stage circuit 210. However, no matter how many input terminals the input-stage circuit 210 has, both the switches SW1 and SW3 are configured to control the electrical connection between the compensation capacitor Cc1 and the input-stage circuit 210, while the output-stage circuit 220 is configured to output the output signal OS based on the response signal RS.

It is to be noted that a switching time, such as a time to turn on or turn off, of the switch SW1 is consistent with the switching time of the switch SW2. A switching time, such as a time to turn on or turn off, of the switch SW3 is consistent with the switching time of the switch SW4. Meanwhile, when the switches SW1 and SW2 are turned on, the switches SW3 and SW4 are turned off. Namely, when the switches SW3 and the SW4 are turned on, the switches SW1 and SW2 are turned off. The relative operation of the output buffer 200 depicted in FIG. 2 will be described as below.

When a voltage of an input terminal of the input-stage circuit 210 is changed, the output terminal of the input-stage circuit 210 is also changed accordingly. The differential input signal Vid includes a positive input signal VS1 and a negative input signal VS2. When the differential input signal Vid received by the input-stage circuit 210 is positive, i.e. the positive input signal VS1 is greater than the negative input signal VS2, the response signal RS generated in the output terminal of the input-stage circuit 210 is a high-state voltage potential signal. Oppositely, when the differential input signal Vid received by the input-stage circuit 210 is negative, i.e. the positive input signal VS1 is smaller than the negative input signal VS2, the response signal RS is a low-state voltage potential signal. The response signal RS is transmitted to an input terminal of the output-stage circuit 220. The output-stage circuit 220 provides a part of gain and a low-impedance output to the response signal RS, and thus, the overall gain of the output buffer 200 is increased for driving a larger load. It should be noted here that in an embodiment of the present invention, when the input-stage circuit 210 is in different output states (e.g. in a high voltage potential or in a low voltage potential), by controlling the switches SW1~SW4 to be turned on or to be turned off, the electrical connection corresponding to the compensation capacitor Cc1 is established between the input-stage circuit 210 and the output-stage circuit 220 by the compensation circuit 230 so as to produce different circuit topology configurations.

For example, if the response signal RS outputted from the input-stage circuit 210 is a high-state voltage potential, both the switches SW1 and SW2 are turned on, and both the switches SW3 and SW4 are turned off. In the meantime, the first terminal CT1 of the compensation capacitor Cc1 is charged by the input-stage circuit 210 to a high-state voltage potential, while the second terminal CT2 of the compensation capacitor Cc1 is discharged to a low-state voltage potential. Thus, the output signal OS of the output-stage circuit 220 is a low-state voltage potential. On the other hand, if the response signal RS outputted from the input-stage circuit 210 is a low-state voltage potential, both the switches SW1 and SW2 are turned off, and both the switches SW3 and SW4 are turned on. In the meantime, the second terminal CT2 of the compensation capacitor Cc1 is maintained in a low-state voltage potential, while the first terminal CT1 of the compensation capacitor Cc1 is maintained in a high-state voltage potential. Thus, the output signal OS of the output-stage circuit 220 is a high-state voltage potential. Accordingly, when the positive input signal VS1 and the negative input signal VS2 are alternatively changed, polarities of both terminals of the compensation capacitor Cc1 may remain unchanged through the switching mechanism of the switches SW1~SW4 in the compensation circuit 230, and the state of the differential input signal Vid is reflected by the output signal OS of the output-stage circuit 220.

It should be mentioned that in an embodiment of the present invention, once the compensation capacitor Cc1 is fully charged, the polarities of both terminals of the compensation capacitor Cc1 are changed, without charging/discharging the compensation capacitor Cc1 every time when the sate of the differential input signal Vid is changed. Accordingly, in an embodiment of the present invention, when an output state of the input-stage circuit 210 is changed, a response speed of the output buffer 200 is relatively increased since the time of charging/discharging the compensation capacitor Cc1 is reduced. In addition, when the output state of the input-stage circuit 210 is changed, through the switching mechanism of the switches SW1~SW4, most of electrical charges on the compensation capacitor Cc1 is maintained so that the time for a bias current of the input-stage circuit 210 charging/discharging the compensation capacitor Cc1 may be reduced. Therefore, the dynamic power consumption generated when the input state of the output buffer 200 is changed may be reduced.

Furthermore, in an embodiment of the present invention, an intermediate-stage circuit (not shown) may be disposed between the input terminal of the output-stage circuit 220 and the input terminal of the compensation circuit 230 for compensating a frequency response to improve the circuit bandwidth. In the present embodiment, the intermediate-stage circuit is composed of a common-gate terminal (CG) amplifier and mainly configured to provide a low-impedance node to the input-stage unit 210, such that a pole generated by the output terminal of the input-stage unit 210 is away from a dominant pole, and the output buffer 200 can ignore influence caused by the low-impedance node on the entire bandwidth. Hereinafter, relative operations of the output buffer 200 will be described according to different embodiments.

Figure 3:
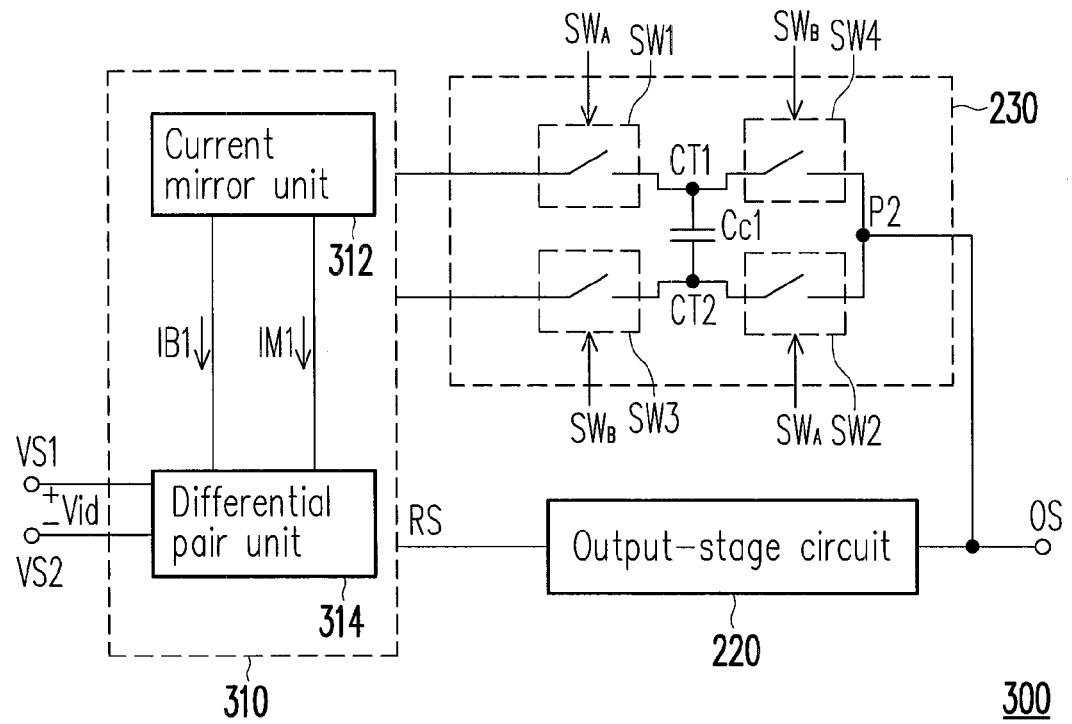
FIG. 3 is a structural schematic diagram illustrating an output buffer according to another embodiment of the present invention.

Referring to FIG. 3, FIG. 3 is a structural schematic diagram illustrating an output buffer 300 according to another embodiment of the present invention. Differing from the embodiment illustrated in FIG. 2, an input-stage circuit 310 of the output buffer 300 includes a differential pair unit 314 and a current mirror unit 312. The differential pair unit 314 outputs the corresponding response signal RS according to the positive input signal VS1 and the negative input signal VS2 that are received. The current mirror unit 312 is coupled to the differential pair unit 314. The current mirror unit 312 is configured to provide a bias current IB1 and a mirrored current IM1. The mirrored current IM1 is generated by the current mirror unit 312 mapping the bias current IB1. Values of the bias current IB1 and the mirrored current IM1 can be adequately designed and adjusted by the designer to satisfy requirements of circuit performance.

Figure 4:
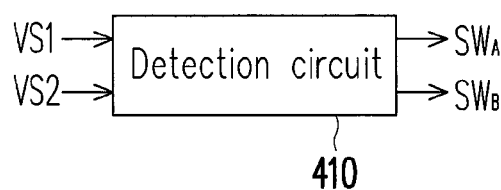
FIG. 4 is a schematic diagram illustrating a detection circuit according to an embodiment of the present invention.

In the present embodiment, the output buffer 300 further includes a detection circuit. Referring to FIG. 3 and FIG. 4, FIG. 4 is a schematic diagram illustrating a detection circuit 410 of the output buffer according to an embodiment of the present invention. The detection circuit 410 receives the positive input signal VS1 and the negative input signal VS2 to generate switch control signals SWA and SWB based on the received signals so as to control the turn-on/turn-off time and operations of the switches SW1~SW4. In detail, the detection circuit 410 compares the voltage potentials of the positive input signal VS1 and negative input signal VS2, and then, according to a comparison result, the detection circuit 410 outputs the switch control signals SWA and SWB so as to control the turn-on/turn-off time and the operations of the switches SW1~SW4.

Figure 5:
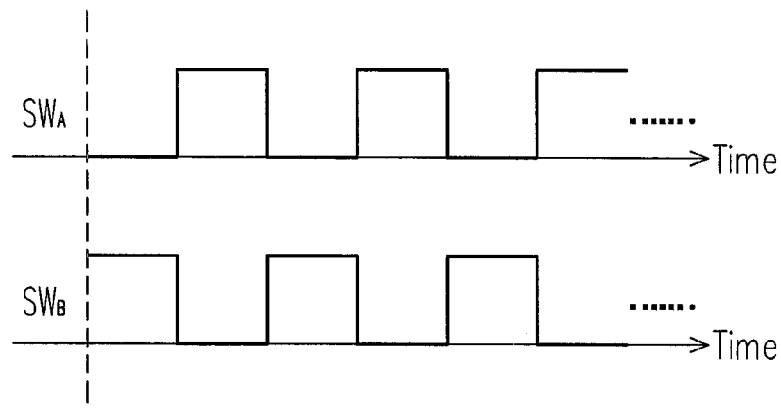
FIG. 5 is a waveform diagram illustrating a turn-on/turn-off signal according to an embodiment of the present invention.

Referring to FIG. 3 with FIG. 5, FIG. 5 is a waveform diagram illustrating a turn-on/turn-off signal according to an embodiment of the present invention. Referring to FIG. 5, the switch control signals SWA and SWB have to alternatively present a high-state voltage potential to turn on or turn off two sets of the switches, alternatively. One set of the switches includes the switches SW1 and SW2, and the other set includes the switches SW3 and SW4. Furthermore, the switch control signal SWA controls the switches SW1 and SW2 to be turned on or turned off, while the switch control signal SWB controls the switch SW3 and SW4 to be turned on or turned off so as to determine the circuit topology configuration of the compensation circuit 230. In other words, through the switch control signals SWA and SWB, whether the first terminal CT1 of the compensation capacitor Cc1 is coupled to the input-stage circuit 310 or to the output terminal P2 of the compensation circuit 230 is determined. When the first terminal CT1 is coupled to the input-stage circuit 310, the second terminal CT2 is coupled to the output terminal P2 of the compensation circuit 230; otherwise, when the first terminal CT1 is coupled to the output terminal P2 of the compensation circuit 230, the second terminal CT2 is coupled to the input-stage circuit 310.

Figure 6:
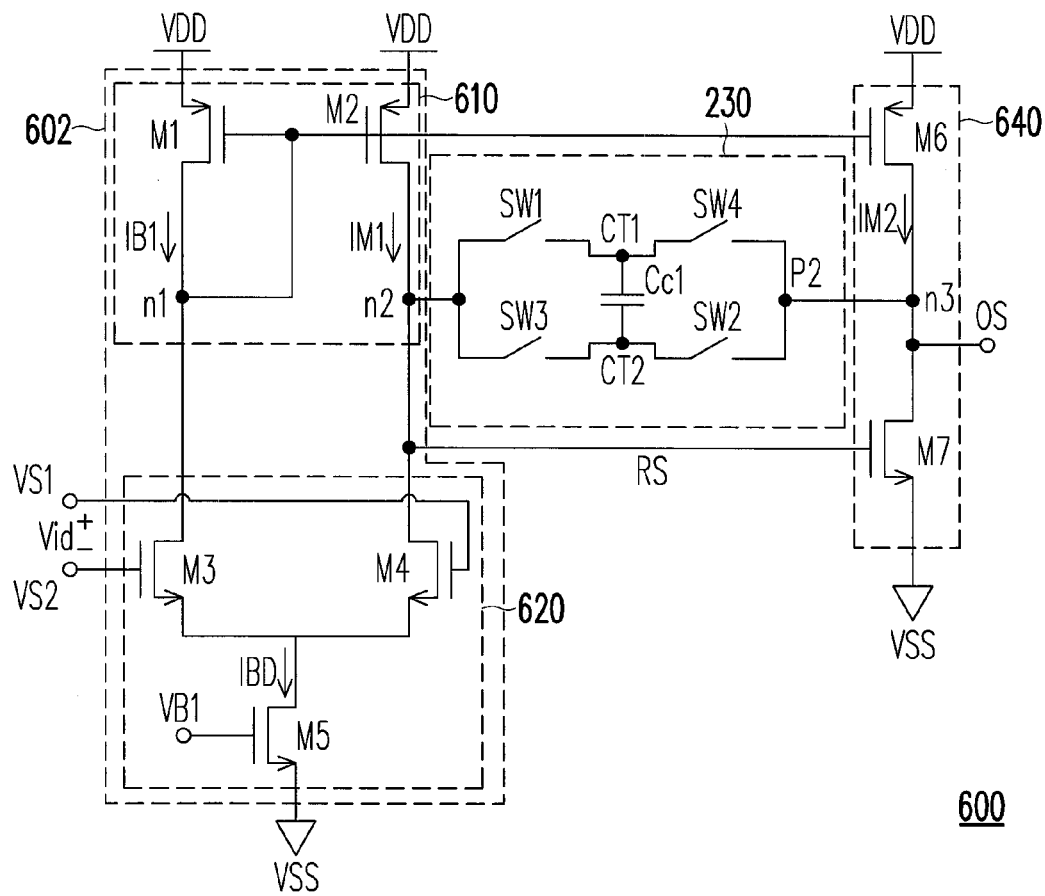
FIG. 6 is a circuit diagram illustrating an output buffer according to an embodiment of the present invention.

Next, referring to FIG. 6, FIG. 6 is a circuit diagram illustrating an output buffer 600 according to an embodiment of the present invention. An input-stage circuit 602 of the output buffer 600 also includes a current mirror unit and a differential pair unit. Differing from the embodiment illustrated in FIG. 3, the current mirror unit 312 depicted in FIG. 3 is implemented by a current mirror circuit 610, while the differential pair unit 314 depicted in FIG. 3 is implemented by the differential amplifier 620 in the present embodiment. The current minor circuit 610 includes transistors M1 and M2, wherein a first source/drain terminal of the transistor M1 is coupled to the first voltage. In the present embodiment, the first voltage is a power voltage VDD. A second source/drain terminal and a gate terminal of the transistor M1 are coupled to a node n1 of the current minor circuit. A gate terminal of the transistor M2 is coupled to the gate terminal of the transistor M1. A first source/drain terminal of the transistor M2 is coupled to the first voltage (i.e. the power voltage VDD), and a second source/drain terminal of the transistor M2 is coupled to a node n2 of the current minor circuit. Therein, the node n1 is coupled to the differential pair unit 314, and the node n2 is coupled to the differential pair unit 314 and the input terminal of the compensation circuit 230. The mirrored current IM1 is outputted through the node n2. It should be noted that in the present embodiment, the transistors M1 and M2 are P-type channel transistors, but the invention is not limited thereto.

On the other hand, the differential amplifier 620 includes transistors M3, M4 and M5. A gate terminal of the transistor M3 receives the negative input signal VS2, and a first source/drain terminal of the transistor M3 is coupled to the node n1 of the current mirror circuit. A gate terminal of the transistor M4 receives the positive input signal VS1, a first source/drain terminal of the transistor M4 is coupled to the node n2 of the current mirror circuit, and the response signal RS is outputted from the node n2. A gate terminal of the transistor M5 receives a bias voltage VB 1. Here, a bias voltage is adequately set by the designer to provide the bias voltage VB 1 according to the requirements of the circuit performance. A first source/drain terminal of the transistor M5 is coupled to the second source/drain terminal of the transistor M3 and the second source/drain terminal of the transistor M4. A second source/drain terminal of the transistor M5 is coupled to the second voltage. In the present embodiment, the second voltage is a ground voltage VSS. It should be noted that the transistors M3, M4 and M5 of the present embodiment are N-type channel transistors, but the present invention is not limited thereto.

An output-stage circuit 640 of the output buffer 600 includes transistors M6 and M7. A gate terminal of the transistor M6 is coupled to the node n1, a first source/drain terminal thereof is coupled to the first voltage (i.e. the power voltage VDD), and a second source/drain terminal thereof is coupled to the second voltage (i.e. the ground voltage VSS). Since the gate terminal of the transistor M6, the gate terminal of the transistor M1 and the gate terminal of the transistor M2 have the same voltage potential, overdrive voltages of the transistors M1, M2 and M6 are the same. Accordingly, the designer may determine the mirrored currents IM1 and IM2 generated by the transistor M2 and M6 by a design of width-to-length ratio, respectively. The mirrored currents IM1 and IM2 are generated by mapping the bias current IB1 of the transistor M1. It is to be mentioned that in a small-signal operation, the transistor M6 is also configured for outputting a resistance and thus, the output-stage circuit 640 may also provide a part of gain. It is to be noted that the transistor M6 is a P-type channel transistor, and the transistor M7 is an N-type channel transistor, but the present invention is not limited thereto. Hereinafter, detailed operations of the output buffer 600 in a large-signal operation will be described.

When the output buffer 600 is operated with a large signal, once the detection circuit 410 detects that the positive input signal VS1 of the input-stage circuit has a voltage smaller than a voltage of the negative input signal VS2, the detection circuit 410 outputs the switch control signals SWA and SWB to turn on the switches SW1 and SW2 and turn off the switches SW3 and SW4 at the same time. In the meantime, the first terminal CT1 of the compensation capacitor Cc1 is coupled to the node n2 through the switch SW1, and the second terminal CT2 of the compensation capacitor Cc1 is coupled to an output terminal (i.e. the node n3) of the output-stage circuit 640 through the switch SW2. A transient operation of the output buffer 600 under such topology configuration of the compensation circuit 230 will be described hereinafter. Since the transistor M3 now is in the turned-on state, and the transistor M4 is in the turned-off state, a differential pair bias current IBD generated by the transistor M5 completely flows through the transistor M3, and the mirrored current IM1 generated by the current mirror circuit 610 starts to charge the first terminal CT1 of the compensation capacitor Cc1. Besides, since the current mirror circuit 610 also maps the mirrored current IM2 mapped flowing through the transistor M6, the transistor M7 of the output-stage circuit 640 is turned on, so that the voltage of the output terminal (i.e. the node n3) of the output-stage circuit 640 moves toward a low-state voltage potential. In the meantime, since the second terminal CT2 of the compensation capacitor Cc1 is coupled to the output terminal (i.e. the node n3) of the output-stage circuit 640 through the switch SW2, the second terminal CT2 of the compensation capacitor Cc1 is discharged via a route formed by the switch SW2 when the voltage of the output terminal (i.e. the node n3) of the output-stage circuit 640 moves toward the low-state voltage potential. Finally, when the output buffer 600 reaches a stable state, the voltage of the first terminal CT1 of the compensation capacitor Cc1 is higher than the voltage of the second terminal CT2.

Oppositely, when the output buffer 600 is operated with the large signal, once the detection circuit 410 detects that positive input signal VS1 has a voltage greater than a voltage of the negative input signal VS2, the detection circuit 410 outputs the switch control signals SWA and SWB to turn off the switches SW1 and SW2 and turn on the switches SW3 and SW4. Here, the first terminal CT1 of the compensation capacitor Cc1 is coupled to the output terminal (i.e. the node n3) of the output-stage circuit 640 through the switch SW4, and the second terminal CT2 of the compensation capacitor Cc1 is coupled to the node n2 through the switch SW3. The transient operation of the output buffer 600 under such topology configuration of the compensation circuit 230 will be described hereinafter. Since the transistor M3 now is in the turned-off state, and the transistor M4 is in the turned-on state, the differential pair bias current IBD generated by the transistor M5 completely flows through the transistor M4 and continuously discharges the second terminal CT2 of the compensation capacitor Cc1 through the switch SW3. The mirrored current IM2 generated by the current mirror circuit 610 continuously charges the first terminal CT1 of the compensation capacitor Cc1. It should be noted that the first terminal CT1 is in a high-state voltage potential and switched from coupling to the node n2 to coupling to the output terminal (i.e. the node n3) of the output-stage circuit 640 so as to be alternated with the second terminal P2 of the compensation circuit.

Finally, when the output buffer 600 reaches the stable state, the voltage of the first terminal CT1 of the compensation capacitor Cc1 is still greater than the voltage of the second terminal CT2. Thus, it should be noted that in an embodiment of the present invention, once the compensation capacitor Cc1 is charged for the first time, the voltage of the first terminal CT1 of the compensation capacitor Cc1 is maintained higher than the voltage of the second terminal CT2 by the switching devices in the compensation circuit 230 no matter whether the voltage of the positive output signal VS1 is greater or smaller than the negative output signal VS2. And, when the input state of the input-stage circuit 640 is alternatively changed, the response speed of the compensation circuit 230 of the output buffer 600 having the switching devices is no longer limited by the time of the bias current of the input-stage circuit charging the compensation capacitor Cc1, so that a stable speed of the output buffer 640 may be improved. Moreover, when the input state of the output buffer 600 is alternatively changed, the electrical charges on the compensation capacitor Cc1 may be mostly maintained through the switching devices of the compensation circuit 230, and the total amount of the electrical charges that the bias current of the input-stage circuit charges/discharges the compensation capacitor is reduced. Accordingly, the dynamic power consumption produced when the input state of the input-stage circuit 640 is alternatively changed may be reduced.

Figure 7:
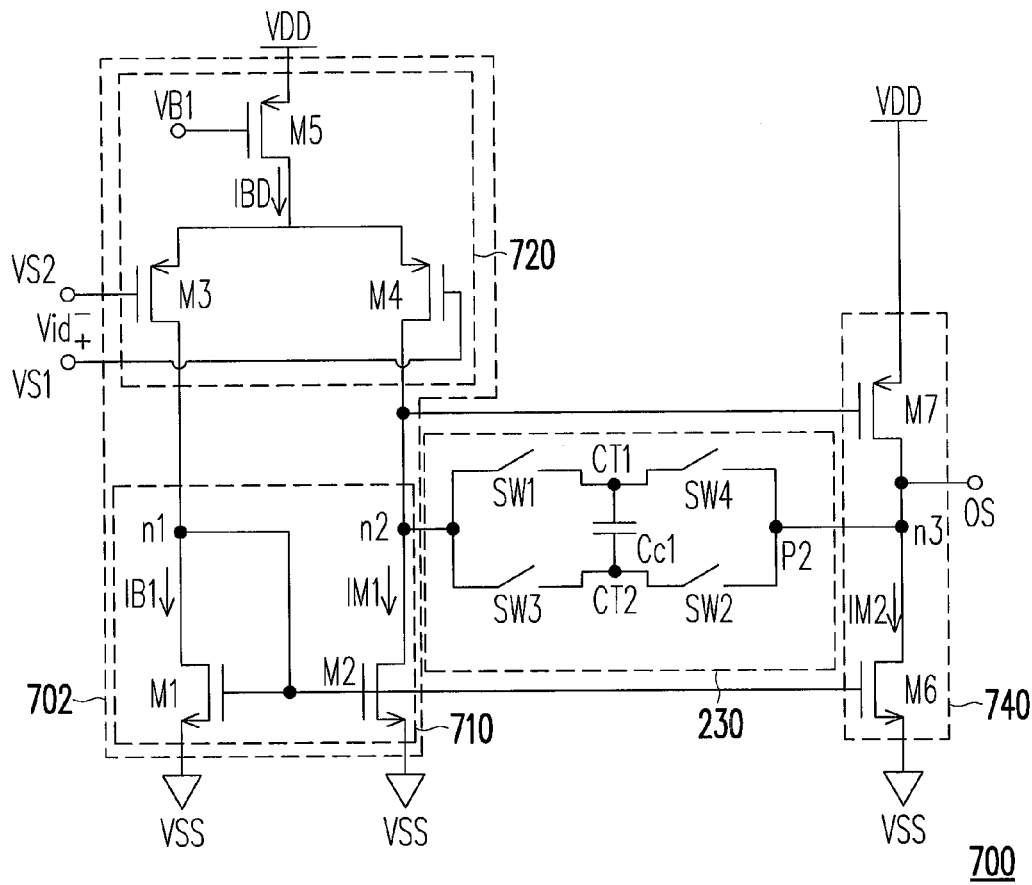
FIG. 7 is a circuit diagram illustrating an output buffer according to another embodiment of the present invention.

Referring to FIG. 7, FIG. 7 is a circuit diagram illustrating an output buffer 700 according to another embodiment of the present invention. In the present embodiment, an input-stage circuit 702 of the output buffer 700 also includes a current mirror unit 710 and a differential pair unit 720. The current mirror circuit 710 includes the transistors M1 and M2. The first source/drain terminal of the transistor M1 is coupled to the first voltage. In the present embodiment, the first voltage is the ground voltage VSS. The second source/drain terminal and the gate terminal of the transistor M1 are coupled to the node n1 of the current mirror circuit 710. The gate terminal of the transistor M2 is coupled to the gate terminal of the transistor M1. The first source/drain terminal of the transistor M2 is coupled to the first voltage (i.e. the ground voltage VSS), and the second source/drain terminal of the transistor M2 is coupled to the node n2 of the current mirror circuit 710, wherein the node n1 is coupled to the differential pair unit, and the node n2 is coupled to the differential pair unit and the input terminal of the compensation circuit 230. The mirrored current IM1 is outputted through the node n2. It should be noted that the transistors M1 and M2 in the present embodiment are N-type channel transistors.

On the other hand, the differential amplifier 720 includes the transistors M3, M4 and M5. The gate terminal of the transistor M3 receives the negative input signal VS2, the first source/drain terminal of the transistor M3 is coupled to the node n1 of the current mirror circuit 710. The gate terminal of the transistor M4 receives the positive input signal VS1, and the first source/drain terminal of the transistor M4 is coupled to the node n2 of the current mirror circuit 710. The response signal RS is outputted from the node n2. The gate terminal of the transistor M5 receives a bias voltage. Here, the designer can configure an adequate bias circuit to provide the bias voltage VB1 according to circuit requirements. The first source/drain terminal of the transistor M5 is coupled to the second source/drain terminal of the transistor M3 and the second source/drain terminal of the transistor M4. The second source/drain terminal of the transistor M5 is coupled to the second voltage. In the present embodiment, the second voltage is the power voltage VDD. It should be noted that the transistors M3, M4 and M5 in the present embodiment are P-type channel transistors.

Further, a circuit topology of the output-stage circuit 740 in a transistor level will be described. The output-stage circuit 740 includes the transistors M6 and M7. The gate terminal of the transistor M6 is coupled to the node n1, the first source/ drain terminal of the transistor M6 is coupled to the first voltage (i.e. the ground voltage VSS), and the second source/drain terminal of the transistor M6 is coupled to the second voltage (i.e. the power voltage VDD). Since the gate terminal of the transistor M6, the gate terminal of the transistor M1 and the gate terminal of the transistor M2 have the same voltage potential, the overdrive voltage of each of the transistors M1, M2 and M6 is equal to each other. The mirrored currents IM1 and IM2 generated by the transistors M1 and M6 are determined by the design of the width-to-length ratio. The mirrored currents IM1 and IM2 are generated by mapping the bias current IB1 of the transistor M1. It is to be mentioned that during the small-signal operation, the transistor M6 is also configured for outputting a resistance, and thus, the output-stage circuit may also provide a part of gain. It should be noted that in the present embodiment, the transistor M6 is an N-type channel transistor, and the transistor M7 is a P-type channel transistor. Detailed operations of the output buffer 700 under the large-signal operation will be described hereinafter.

When the output buffer 700 is operated with the large signal, once the detection circuit 410 detects that the voltage of the positive input signal VS1 is greater than the voltage of the negative input signal VS2, the detection circuit 410 outputs the switch control signals SWA and SWB to turn on the switches SW1 and SW2 and turn off the switches SW3 and SW4 at the same time. At this time, the first terminal CT1 of the compensation capacitor Cc1 is coupled to the node n2 through the switch SW1, and the second terminal CT2 of the compensation capacitor Cc1 is coupled to the output terminal (i.e. the node n3) of the output-stage circuit 740 through the switch SW2. A transient operation of the output buffer 700 under such topology configuration of the compensation circuit 230 will be described hereinafter. Since the transistor M4 now is in the turned-on state, and the transistor M3 is in the turned-off state, the differential bias current IBD generated by the transistor M5 completely flows through the transistor M4 and starts to charge the first terminal CT1 of the compensation capacitor Cc1 through the switch SW1, which contributes to turning-off the transistor M7 of the output-stage circuit 740, so that the voltage of the output terminal of the output-stage circuit 740 moves toward a low-state voltage potential. In the meantime, the second terminal CT2 of the compensation capacitor Cc1 is coupled to the output terminal of the output-stage circuit 740 through the switch SW2. Thus, the second terminal CT2 of the compensation capacitor Cc1 is discharged by the switch SW2 and the transistor M6 while the output terminal of the output-stage circuit 740 moves toward the low-state voltage potential. Then, when the output buffer 700 reaches the stable state, the voltage of the first terminal CT1 of the compensation capacitor Cc1 is greater than the voltage of the second terminal CT2.

Oppositely, when the output buffer 700 is operated with the large signal, once the detection circuit 410 detects that the voltage of the positive input signal VS1 is smaller than the voltage of the negative input signal VS2, the detection circuit 410 outputs the switch control signals SWA and SWB to turn off the switch SW1 and SW2 and turn on the switch SW3 and SW4 at the same time. At this time, the first terminal CT1 of the compensation capacitor Cc1 is coupled to the output terminal of the output-stage circuit 740 through the switch SW4, and the second terminal CT2 of the compensation capacitor Cc1 is coupled to the node n2 through the switch SW3. Afterward, the transient operation of the output buffer 700 under such topology configuration of the compensation circuit 230 will be described. Since the transistor M4 now is in the turned-off state, and he transistor M3 is in the turned-on state, the differential bias current IBD generated by the transistor M5 completely flows through the transistor M3. Through the conversion of the current mirror circuit 710 (i.e. the conversion of the transistor M1 and the transistor M2) and the connection between the switch SW3 and the second terminal CT2 of the compensation capacitor Cc1, the second terminal CT2 of the compensation capacitor Cc1 is continuously discharged. Meanwhile, since the current mirror circuit 710 also maps the mirrored current IM2 flowing through the transistor M6, the transistor M7 in the output-stage circuit 740 may be turned on so that the voltage of the output terminal of the output-stage circuit 740 moves toward a high-state voltage potential. In the meantime, since the second terminal CT2 of the compensation capacitor Cc1 is coupled to the output terminal of the output-stage circuit 740 through the switch SW4, the second terminal CT2 of the compensation capacitor Cc1 is continuously charged through the switch SW4 and the transistor M7 when the voltage of the output terminal of the output-stage circuit 740 moves toward the high-state voltage potential. Lastly, when the output buffer 700 reaches the stable state, the voltage of the first terminal CT1 of the compensation capacitor Cc1 is still greater than the voltage of the second terminal CT2.

Accordingly, it should be noted that in an embodiment of the present invention, when the input state of the input-stage circuit is alternatively changed, the response speed of the compensation circuit 230 of the output buffer 700 having the switching devices is no longer limited by the time that the bias current of the input-stage circuit charges/discharges the compensation capacitor Cc1. Thus, the stable speed of the output buffer 700 may be improved. Moreover, when the input state of the output buffer 700 is alternatively changed, the electrical charges on the compensation capacitor Cc1 may be mostly maintained through the switching devices of the compensation circuit 230 so that the total amount of the electrical charges that the bias current of the input-stage circuit charges/discharges the compensation capacitor Cc1 may be reduced. Thus, the dynamic power consumption generated when the input state of the output buffer 700 is alternatively changed may be reduced.

Figure 8:
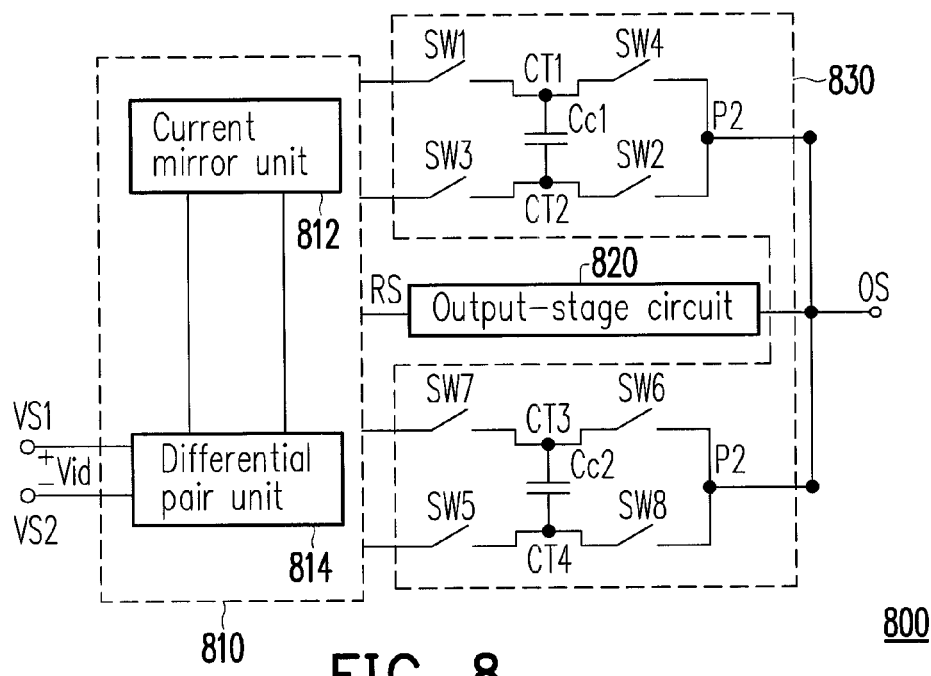
FIG. 8 is a circuit diagram illustrating an output buffer according to still another embodiment of the present invention.

Referring to FIG. 8, FIG. 8 is a circuit diagram illustrating an output buffer 800 according to still another embodiment of the present invention. Differing from FIG. 3, beside the compensation capacitor Cc1 and the switches SW1~SW4, a compensation circuit 830 of the output buffer 800 of the present embodiment further includes a compensation capacitor Cc2 and switches SW5~SW8. The compensation capacitor Cc2 has a first terminal CT3 and a second terminal CT4. The switch SW5 is configured to control an electrical connection between an input-stage circuit 810 of the output buffer 800 and the second terminal CT4 of the compensation capacitor Cc2. The switch SW6 is configured to control an electrical connection between the output terminal P2 of the compensation circuit 830 and the first terminal CT3 of the compensation capacitor Cc2. The switch SW7 is configured to control an electrical connection between the input-stage circuit 810 and the first terminal CT3 of the compensation capacitor Cc2. The switch SW8 is configured to control an electrical connection between the output terminal P2 of the compensation circuit 830 and the second terminal CT4 of the compensation capacitor Cc2.

It should be noted that in the present embodiment, turn-on/turn-off time of the switch SW5 is consistent with turn-on/turn-off time of the switch SW6, while turn-on/turn-off time of the switch SW7 is consistent with turn-on/turn-off time of the switch SW8. Meanwhile, when the switches SW5 and SW6 are turned on, the switches SW7 and SW8 are turned off Namely, when the switches SW5 and SW6 are turned off, the switches SW7 and SW8 are turned on. In addition, in an embodiment of the present invention, the turn-on/turn-off time of the switches SW5 and SW6 is consistent with the turn-on/turn-off time of the switches SW1 and SW2, while the turn-on/turn-off time of the switches SW7 and SW8 is consistent with the turn-on/turn-off time of the switches SW3 and SW4. And, when the switches SW1, SW2, SW5 and SW6 are turned on, the switches SW3, SW4, SW7 and SW8 are turned off Likewise, when the switches SW3, SW4, SW7 and SW8 are turned on, the switches SW1, SW2, SW5 and SW6.

The detection circuit 410 is used to determine whether to turn on or turn off the switches SW1~SW8 based on the positive input signal VS1 and the negative input signal VS2 so as to output the switch control signals SWA and SWB to control the turn-on/turn-off time of the switches SW1~SW8 and determine the circuit topology configuration of the compensation circuit 830. As for main functions of the current mirror unit 812, the differential pair unit 814 and the output-stage circuit 820, they are substantially the same as those of the current mirror unit 312, the differential pair unit 314 and the output-stage circuit 220 illustrated in FIG. 3.

Figure 9:
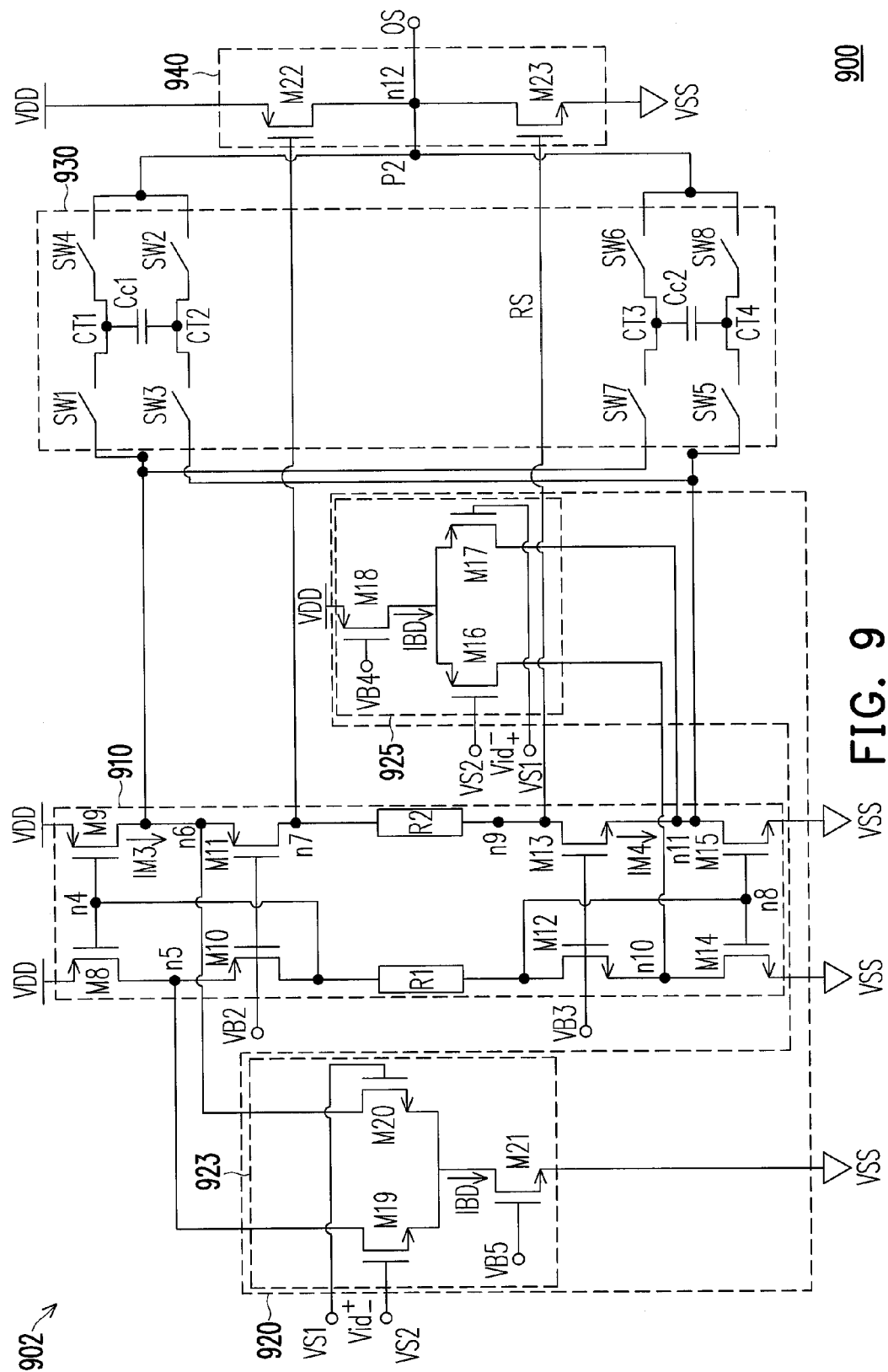
FIG. 9 is a circuit diagram illustrating an output buffer according to yet another embodiment of the present invention.

Next, referring to FIG. 9, FIG. 9 is a circuit diagram illustrating an output buffer 900 according to yet another embodiment of the present invention. An input-stage circuit 902 of the output buffer 900 also includes a current mirror unit and a differential pair unit. The current mirror unit of the input-stage circuit 902 is a rail-to-rail current mirror circuit 910, and the differential pair unit of the input-stage circuit 902 is a rail-to-rail differential amplifier 920. The output buffer 900 further includes a compensation circuit 930 and an output-stage circuit 940. The compensation circuit 930 is coupled between the input-stage circuit 902 and the output-stage circuit 940.

In the present embodiment, the rail-to-rail differential amplifier 920 includes a N-type differential amplifier 923 and a P-type differential amplifier 925. The rail-to-rail current mirror circuit 910 includes transistors M8 M15 and impedance-providing devices R1~R2. A source terminal of the transistor M8 is coupled to the first voltage. In the present embodiment, the first voltage is the power voltage VDD. A gate terminal of the transistor M8 is coupled to a node n4, a drain of the transistor M8 is coupled to a node n5. A source terminal of the transistor M9 is coupled to the first voltage (i.e. the power voltage VDD), a gate terminal of the transistor M9 is coupled to the node n4, and a drain terminal of the transistor M9 is coupled to a node n6. The switches SW1 and SW5 are coupled to the node n6. A source terminal of the transistor M10 is coupled to the node n5, a drain terminal of the transistor M10 is coupled to the node n4, and a gate terminal of the transistor M10 receives a bias voltage VB2. A source terminal of the transistor M11 is coupled to the node n6, a gate terminal of the transistor M11 is coupled to the gate terminal of the transistor M10, and a drain terminal of the transistor M11 is coupled to a node n7. It should be noted that in the present embodiment, the transistors M8~M11 are P-type channel transistors, but the present invention is not limited thereto.

A terminal of the impedance-providing device R1 is coupled to the node n4, and the other terminal is coupled to a node n8. A terminal of the impedance-providing device R2 is couple to the node n7, and the terminal is coupled to a node n9, wherein the response signal RS is outputted from the node n9. A drain terminal of the transistor M12 is coupled to the node n8, a source terminal of the transistor M12 is coupled to a node n10, and a gate terminal of the transistor M12 receives a bias voltage VB3. A drain terminal of the transistor M13 is coupled to the node n9, a gate terminal of the transistor M13 is coupled to the gate terminal of the transistor M12, and a source terminal of the transistor M13 is coupled to a node n11, wherein the switches SW3 and SW7 are coupled to the node n11. A drain terminal of the transistor M14 is coupled to the node n11, a gate terminal of the transistor M14 is coupled to the node n8, and a source terminal of the transistor M14 is coupled to the second voltage. In the present embodiment, the second voltage is the ground voltage VSS. A drain terminal of the transistor M15 is coupled to the node n10, a gate terminal of the transistor M15 is coupled to the node n8, and a source terminal of the transistor M15 is coupled to the second voltage (i.e. the ground voltage VSS). The node n5 and the node n10 are coupled to the rail-to-rail differential amplifier, and the node n6 and the node n11 are coupled to the rail-to-rail differential amplifier and an input terminal of the compensation circuit 930. In the present embodiment, the transistors M12, M13, M14 and M15 are N-type channel transistors, but the present invention is not limited thereto.

In the present embodiment, the P-type differential amplifier 925 includes transistors M16, M17 and M18. A gate terminal of the transistor M16 receives the negative input signal VS2, a drain terminal of the transistor M16 is coupled to the node n10 of the rail-to-rail current mirror circuit 910. A gate terminal of the transistor M17 receives the positive input signal VS1, a drain terminal of the transistor M17 is coupled to the node n11 of the rail-to-rail current mirror circuit 910. A gate terminal of the transistor M18 receives a bias voltage VB4, a gate terminal of the transistor M18 is coupled to the source terminal of the transistor M16 and the source terminal of the transistor M17, and a source terminal of the transistor M18 is coupled to the first voltage (i.e. the power voltage VDD). It should be noted that in the present embodiment, the transistors M16, M17 and M18 are P-type channel transistors. The N-type differential amplifier 923 includes transistors M19, M20 and M21. A gate terminal of the transistor M19 receives the negative input signal VS2, a drain terminal of the transistor M19 is coupled to the node n5 of the rail-to-rail current mirror circuit 910. A gate terminal of the transistor M20 receives the positive input signal VS1, a drain terminal of the transistor M20 is coupled to the node n6 of the rail-to-rail current mirror circuit 910. A gate terminal of the transistor M21 receives a bias voltage VB5, a drain terminal of the transistor M21 is coupled to the source terminal of the transistor M19 and the source terminal of the transistor M20, and a source terminal of the transistor M21 is coupled to the second voltage (i.e. the ground voltage VSS). It should be noted that in the present embodiment, the transistors M19, M20 and M21 are N-type channel transistors, but the present invention is not limited thereto.

Further, a circuit topology of the output-stage circuit 940 in a transistor level will be described. The output-stage circuit 940 includes transistors M22 and M23. A gate terminal of the transistor M22 is coupled to the node n7, a source terminal of the transistor M22 is coupled to the first voltage (i.e. the power voltage VDD), and a drain terminal of the transistor M22 is coupled to a node n12. A gate terminal of the transistor M23 is coupled to the node n9 and configured to receive the response signal RS, and a source terminal of the transistor M23 is coupled to the node n12 and configured to output the output signal OS. A source terminal of the transistor M23 is coupled to the second voltage (i.e. the ground voltage VSS). It should be noted that in the present embodiment, the transistor M22 is a P-type channel transistor, and the transistor M23 is an N type channel transistor, but the present invention is not limited thereto. Upon the introduction of all the elements and the coupling relationship thereof in the present embodiment, detailed operations of circuits of the output buffer 900 will be described hereinafter.

During a large-signal operation, once the detection circuit detects that the voltage of the positive input signal VS1 of the input-stage circuit is greater than the voltage of the negative input signal VS2, the switch control signals SWA and SWB are outputted to turn on the switches SW1, SW2, SW5 and SW6 and turn off the switches SW3, SW4, SW7 and SW8 at the same time. At this time, the first terminal CT1 of the compensation capacitor Cc1 is coupled to the node n6 through the switch SW1, and the second terminal CT2 of the compensation capacitor Cc1 is coupled to the output terminal (i.e. the node n12) of the output-stage circuit 940 through the switch SW2. The second terminal CT4 of the compensation capacitor Cc2 is coupled to the node n11 through the switch SW5, and the first terminal CT3 of the compensation capacitor Cc2 is coupled to the output terminal (i.e. the node n12) of the output-stage circuit 940 through the switch SW6. Afterward, a transient operation of the output buffer 900 under such topology configuration of the compensation circuit 930 will be described.

First, as for the N-type differential amplifier 923, since the transistor M20 now is in the turned-on state, and the transistor M19 is in the turned-off state, a differential bias current IBD of the N-type differential amplifier 923 completely flows through the transistor M20 and starts to discharge the first terminal CT1 of the compensation capacitor Cc1 through the switch SW1. Since a mirrored current IM3 generated by the rail-to-rail current mirror circuit 910 mostly flows through the transistor M20, the transistor M11 is almost in the turned-off state, which contributes to turn on the transistor M22 in the output-stage circuit 940, so that the output terminal of the output-stage circuit 940 outputs a high-state voltage potential. Besides, since the second terminal CT2 of the compensation capacitor Cc1 is coupled to the output terminal of the output-stage circuit 940, the voltage of the second terminal CT2 of the compensation capacitor Cc1 is increased while the output terminal of the output-stage circuit 940 outputs the high-state voltage potential. In the meantime, the differential bias current IBD of the input-stage circuit 940 continuously discharges the first terminal CT1 of the compensation capacitor Cc1 through the switch SW1 until the compensation capacitor Cc1 is discharged to a state of low stored charges.

Likewise, as for the P-type differential amplifier 925, when the voltage of the positive input signal VS1 of the input-stage circuit is greater than the negative input signal VS2, the transistor M16 is in the turned-on state, and the transistor M17 is in turned-off state. Thus, the differential bias current IBD of the P-type differential amplifier 925 completely flows through the transistor M16, and through the conversion of the rail-to-rail current mirror circuit 910 (i.e. the conversion of the transistors M14 and M15), a current of the transistor M16 based on a width-to-length ratio is transmitted to the transistor M15 to charge the second terminal CT4 of the compensation capacitor Cc2 through the switch SW5. Meanwhile, since the transistor M17 is in the turned-off state, the mirrored currents IM3 and IM4 of the rail-to-rail current mirror circuit 910 mostly flow through the transistor M13, which contributes to turn on the transistor M23 in the output-stage circuit 940. Thus, the stable speed from the output terminal of the output-stage circuit 940 moving toward the high-state voltage potential is improved. Besides, since the first terminal CT3 of the compensation capacitor Cc2 is coupled to the output terminal of the output-stage circuit 940, when the output terminal of the output-stage circuit 940 is a high-state voltage potential, the first terminal CT3 of the compensation capacitor Cc2 is continuously charged toward the high-state voltage potential by the current flowing through the transistor M22 in the output-stage circuit 940 through the switch SW6 until the compensation capacitor Cc2 is finally charged to a state of high stored charges.

On the other hand, during the large-signal operation, as the same, once the detection circuit detects that the voltage of the positive input signal VS1 of the input-stage circuit is smaller than the voltage of the negative input signal VS2, the switch control signals SWA and SWB are outputted to turn off the switches SW1, SW2, SW5 and SW6 and turn on the switches SW3, SW4, SW7 and SW8. At this time, the second terminal CT2 of the compensation capacitor Cc1 is coupled to the node n11 through the switch SW3, while the first terminal CT1 of the compensation capacitor Cc1 is coupled to the output terminal (i.e. the node n12) of the output-stage circuit 940 through the switch SW4. The first terminal CT3 of the compensation capacitor Cc2 is coupled to the node n6 through the switch SW7, while the second terminal CT4 of the compensation capacitor Cc2 is coupled to the output terminal (i.e. the node n12) of the output-stage circuit 940 through the switch SW8. The transient operation of the output buffer 900 under such topology configuration of the compensation circuit 930 will be described hereinafter.

First, as for the N-type differential amplifier 923, since the transistor M19 now is in the turned-on state, and the transistor M20 is in the turned-off state, the differential bias current IBD of the N-type differential amplifier 923 completely flows through the transistor M19 and continuously charges the first terminal CT3 of the compensation capacitor Cc2 through the switch SW7 by the conversion of the rail-to-rail current mirror circuit 910 (by the conversion of the transistors M8 and M9). Besides, the mirrored current IM3 in the rail-to-rail current mirror circuit 910 flows to the transistor M11 so that the transistor M22 is turned off. Thus, the output terminal of the output-stage circuit 940 moves toward a low-state voltage potential. It should be noted that the second terminal CT4 of the compensation capacitor Cc2 now is coupled to the output terminal of the output-stage circuit 940, and thus, the second terminal CT4 of the compensation capacitor Cc2 is continuously discharged through the switch SW8.

Likewise, as for P-type differential amplifier 925, when the voltage of the positive input signal VS1 of the input-stage circuit is smaller than the negative input signal VS2, the transistor M16 is in the turned-off state, and the transistor M17 is in turned-on state. Thus, the differential bias current IBD of the P-type differential amplifier 925 completely flows through the transistor M17. Since the differential bias current IBD flowing through the transistor 17 mostly flows through the transistor 15, the transistor 13 is almost turned off. Thus, the transistor 23 of the output-stage circuit 940 is turned on, and the output terminal of the output-stage circuit 940 outputs a low-state voltage potential. In the meantime, the first terminal CT1 of the compensation capacitor Cc1 in the state of low stored charges is electrically connected with the output terminal of the output-stage circuit 940 through the switch SW4. Accordingly, when the output terminal of the output-stage circuit 940 is in a low-state voltage potential, the voltage of the second terminal CT2 of the compensation capacitor Cc1 will be dropped. At this time, the differential bias current IBD of the input-stage circuit continuously discharges the compensation capacitor Cc1 in the state of low stored charges by the current of the rail-to-rail current mirror circuit 910 through the switches SW3 and SW4.

Accordingly, in the present embodiment (i.e. the embodiment illustrated in FIG. 9), when the input state of the differential input signal Vid received by the output buffer 900 is alternatively changed, the voltage of the output terminal of the output-stage circuit 940 is also changed. At this time, switching devices of the internal compensation circuit 930 of the output buffer 900 changes the circuit topology configurations of the compensation capacitor Cc1 and the compensation capacitor Cc2 in response to the change of input and output states of the output buffer 900 so as to maintain the storage state of the electrical charges on the compensation capacitor Cc1 and the compensation capacitor Cc2. And, the bias current of the input-stage circuit no longer needs to alternatively charge/discharge the compensation capacitor Cc1 and the compensation capacitor Cc2. Thus, by the technique using the switching devices in the compensation circuit 930, not only response speed of the entire circuit of the output buffer 900 can be increased, but also the power consumption of the entire circuit of the output buffer 900 can be saved. In short, by the switching technique used in the compensation circuit 930, the speed of the output buffer 900 under the large-signal operation can be effectively enhanced, and under the small-signal operation, high quality of original frequency response can be maintained.

Based on the above, the output buffer provided by some exemplary embodiments of the present invention may have at least one or more of advantages as follows. When the input state of the output buffer is alternatively changed, the entire circuit of the output buffer quickly enters the stable state by the switching technique of the compensation circuit, without slowly charging/discharging the compensation capacitor by the bias current of the input-stage circuit.

When the input state of the output buffer is alternatively changed, the charge state of the compensation capacitor is maintained through the switching technique of the compensation circuit, without re-charging/re-discharging the compensation capacitor, so that the dynamic power consumption is saved.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An output buffer, comprising:
    an input-stage circuit, configured to receive a differential input signal to output a response signal;
    an output-stage circuit, coupled to the input-stage circuit and configured to receive the response signal and output an output signal according to the response signal; and
    a compensation circuit, coupled between the input-stage circuit and an output terminal of the output-stage circuit, wherein the compensation circuit comprises
        a first compensation capacitor, having a first terminal and a second terminal;
        a first switch, configured to control electrical connection between the input-stage circuit and the first terminal of the first compensation capacitor;
        a second switch, configured to control electrical connection between an output terminal of the compensation circuit and the second terminal of first compensation capacitor;
        a third switch, configured to control electrical connection between the input-stage circuit and the second terminal of the first compensation capacitor; and
        a fourth switch, configured to control electrical connection between the output terminal of the compensation circuit and the first terminal of the first compensation capacitor, wherein a switching time of the first switch is consistent with that of the second switch, and a switching time of the third switch is consistent with the fourth switch,
    wherein when the first switch and the second switch are turned on, the third switch and the fourth switch are turned off, and
    wherein when the third switch and the fourth switch are turned on, the first switch and the second switch are turned off.

2. The output buffer as recited in claim 1, wherein the differential input signal comprises a positive input signal and a negative input signal, the input-stage circuit comprising:
    a differential pair unit, outputting the response signal according to the positive input signal and the negative input signal that are received; and
    a current mirror unit, coupled to the differential pair unit and configured to provide a bias current and a mirrored current, wherein the current mirror unit maps the bias current to generate the mirrored current.

3. The output buffer as recited in claim 2, further comprising a detection circuit configured to control the first switch, the second switch, the third switch and the fourth switch according to the positive input signal and the negative input signal.

4. The output buffer as recited in claim 2, wherein the current mirror unit is a current mirror circuit, the current mirror circuit comprising:
    a first transistor, having a first source/drain terminal coupled to a first voltage, a second source/drain terminal and a gate terminal coupled to a first node of the current mirror circuit; and
    a second transistor, having a gate terminal coupled to the gate terminal of the first transistor, a first source/drain terminal coupled to the first voltage and a second source/drain terminal coupled to a second node of the current mirror circuit,
    wherein the first node is coupled to the differential pair unit, the second node is coupled to the differential pair unit and an input terminal of the compensation circuit, the bias current flows to the differential pair unit through the first node, and the mirrored current is outputted via the second node.

5. The output buffer as recited in claim 4, wherein the first voltage is a power voltage.

6. The output buffer as recited in claim 4, wherein the first voltage is a ground voltage.

7. The output buffer as recited in claim 2, wherein the differential pair unit is a differential amplifier, the differential amplifier comprising:
    a third transistor, having a gate terminal receiving the negative input signal and a first source/drain terminal coupled to a first node of the current mirror circuit;
    a fourth transistor, having a gate terminal receiving the positive input signal and a first source/drain terminal coupled to a second node of the current mirror circuit, wherein the response signal is outputted from the second node; and
    a fifth transistor, having a gate terminal receiving a first bias voltage, a first source/drain terminal coupled to the second source/drain terminal of the first transistor and the second source/drain terminal of the second transistor and a second source/drain terminal coupled to a second voltage.

8. The output buffer as recited in claim 7, wherein the second voltage is a power voltage.

9. The output buffer as recited in claim 7, wherein the second voltage is a ground voltage.

10. The output buffer as recited in claim 2, wherein the output-stage circuit comprises:
a sixth transistor, having a gate terminal coupled to the first node, a first source/drain terminal coupled to a first voltage and a second source/drain terminal coupled to a third node; and
a seventh transistor, having a gate terminal coupled to a second node and configured to receive the response signal, a first source/drain terminal coupled to the third node and configured to output the output signal and a second source/drain terminal coupled to a second voltage.

11. The output buffer as recited in claim 2, wherein the current mirror unit is a rail-to-rail current mirror circuit, and the differential pair unit is a rail-to-rail differential amplifier.

12. The output buffer as recited in claim 11, wherein the rail-to-rail current mirror circuit comprises:
an eighth transistor, having a source terminal coupled to a first voltage, a gate terminal coupled to a fourth node and a drain terminal coupled to a fifth node;
a ninth transistor, having a source terminal coupled to the first voltage, a gate terminal coupled to the fourth node and a drain terminal coupled to a sixth node, wherein the first switch is coupled to the sixth node;
a tenth transistor, having a source terminal coupled to the fifth node, a drain terminal coupled to the fourth node and a gate terminal receiving a second bias voltage; and
an eleventh transistor, having a source terminal coupled to the sixth node, a gate terminal coupled to the gate terminal of the tenth transistor and a drain terminal coupled to a seventh node.

13. The output buffer as recited in claim 12, wherein the rail-to-rail current mirror circuit further comprises:
a first impedance-providing device, having a first terminal coupled to the fourth node and a second terminal coupled to an eighth node; and
a second impedance-providing device, having a first terminal coupled to the seventh node and a second terminal coupled to a ninth node, wherein the response signal is outputted from the seventh node and the ninth node.

14. The output buffer as recited in claim 12, wherein the rail-to-rail current mirror circuit further comprises:
a twelfth transistor, having a drain terminal coupled to a ninth node, a source terminal coupled to a tenth node and a gate terminal coupled to a third bias voltage;
a thirteenth transistor, having a drain terminal coupled to the ninth node, a gate terminal coupled to a gate terminal of the twelfth transistor and a source terminal coupled to a eleventh node, wherein the third switch is coupled to the eleventh node;
a fourteenth transistor, having a drain terminal coupled to the tenth node, a gate terminal coupled to the eighth node and a source terminal coupled to a second voltage; and
a fifteenth transistor, having a drain terminal coupled to the eleventh node, a gate terminal coupled to the eighth node and a source terminal coupled to the second voltage,
wherein the fifth node and the tenth node are coupled to the rail-to-rail differential amplifier, the sixth node and the eleventh node are coupled to the rail-to-rail differential amplifier and the input terminal of the compensation circuit.

15. The output buffer as recited in claim 11, wherein the rail-to-rail differential amplifier comprises:
a P-type differential amplifier; and
an N-type differential amplifier.

16. The output buffer as recited in claim 15, wherein the P-type differential amplifier comprises:

a sixteenth transistor, having a gate terminal receiving the negative input signal and a drain terminal coupled to the tenth node of the rail-to-rail current mirror circuit;
a seventeenth transistor, having a gate terminal receiving the positive input signal and a drain terminal coupled to an eleventh node of the rail-to-rail current mirror circuit; and
an eighteenth transistor, having a gate terminal receiving a fourth bias voltage, a drain terminal coupled to the source terminal of the sixteenth transistor and the source terminal of the seventeenth transistor and a source terminal coupled to a first voltage.

17. The output buffer as recited in claim 15, wherein the N-type differential amplifier comprises:
a nineteenth transistor, having a gate terminal receiving the negative input signal and a drain terminal coupled to a fifth node of the rail-to-rail current mirror circuit;
a twentieth transistor, having a gate terminal receiving the positive input signal and a drain terminal coupled to a sixth node of the rail-to-rail current mirror circuit; and
a twenty-first transistor, having a gate terminal receiving a fifth bias voltage, a drain terminal coupled to the source terminal of the nineteenth transistor and the source terminal of the twentieth transistor and a source terminal coupled to a second voltage.

18. The output buffer as recited in claim 11, wherein the compensation circuit further comprises:
a second compensation capacitor, having a first terminal and a second terminal;
a fifth switch, configured to control electrical connection between the input-stage circuit and the second terminal of the second compensation capacitor;
a sixth switch, configured to control electrical connection between the output terminal of the compensation circuit and the first terminal of the second compensation capacitor;
a seventh switch, configured to control electrical connection between the input-stage circuit and the first terminal of the second compensation capacitor; and
an eighth switch, configured to control electrical connection between the output terminal of the compensation circuit and the second terminal of the second compensation capacitor,
wherein a switching time of the fifth switch is consistent with that of the sixth switch, and a switching time of the seventh switch is consistent with that of the eighth switch,
wherein when the fifth switch and the sixth switch are turned on, the seventh switch and the eighth switch are turned off;
wherein when the seventh switch and the eighth switch are turned on, the fifth switch and the sixth switch are turned off.

19. The output buffer as recited in claim 18, wherein the switching time of the fifth switch and the sixth switch is consistent with that of the first switch and the second switch, and the switching time of the seventh switch and the eighth switch is consistent with that of the third switch and the fourth switch,
wherein when the first switch, the second switch, the fifth switch and the sixth switch are turned on, the third switch, the fourth switch, the seventh switch and the eighth switch are turned off, and
wherein when the third switch, fourth switch, seventh switch and the eighth switch are turned on, the first switch, the second switch, the fifth switch and the sixth switch are turned off.

20. The output buffer as recited in claim 11, wherein the output-stage circuit comprises:
- a twenty-second transistor, having a gate terminal coupled to the seventh node, a source terminal coupled to a first voltage and a drain terminal coupled to a twelfth node; and
- a twenty-third transistor, having a gate terminal coupled to the ninth node and configured to receive the response signal, a drain terminal coupled to the twelfth node and configured to output the output signal and a source terminal coupled to the second voltage.

* * * * *